March 2, 1965 F. E. MEYER 3,171,741

PRINTED WIRING LAYOUT PROCESS

Filed June 16, 1958 2 Sheets-Sheet 1

INVENTOR.
FRANK E. MEYER

BY

Francis E. Blake

ATTORNEY

March 2, 1965 F. E. MEYER 3,171,741

PRINTED WIRING LAYOUT PROCESS

Filed June 16, 1958 2 Sheets-Sheet 2

INVENTOR.
FRANK E. MEYER

BY

Francis E. Blake

ATTORNEY 3,171,741
PRINTED WIRING LAYOUT PROCESS

Frank E. Meyer, Holcombe, N.Y., assignor to General Dynamics Corporation, Rochester, N.Y., a corporation of Delaware Filed June 16, 1958, Ser. No. 742,345
8 Claims. (Cl. 96—27)

This invention relates to a process and to articles that are useful for converting a variety of circuit configurations into printed wiring assemblies on a mass production basis.

The first step in making a printed wiring board or card is the preparation of a circuit-pattern drawing or "artwork" usually on an enlarged scale. This artwork depicts a pattern of metallic conductors that is desired for the particular printed board. In one process, a negative reproduction is made of this drawing, on the copper surface of a copper-clad plastic insulating base, by silk screening to form a resist coating. The base is then placed in a special chemical bath to etch and remove the unwanted portions of the metal from the base. After etching, the base is cleaned and dried, and it is then ready for fabrication and assembly.

The lands and interconnection paths or highways that are etched on the surface of the plastic base are only as clear, clean, and as well defined as the circuit-pattern drawing from which the reproduction on the base is made. For this reason, this drawing is generally prepared by a skilled draftsman on the basis of a rough sketch that is provided by an engineer. The drawing ordinarily is executed in black ink on stable white board. This provides the necessary contrast for good photographic reproduction and the necessary dimensional stability. For close tolerances, a drawing material that has exceptional dimensional stability is used, such as, for example, plastic-impregnated glass cloth.

Two other drawings are presently required for each printed wiring assembly, in addition to the circuit pattern drawing or artwork. These two other drawings are the facsimile drawing and the assembly drawing.

The facsimile drawing is a representation of the desired printed pattern of metallic conductors on the base, with dimensions and drilling information added, to permit holes to be drilled in the base at proper locations for the insertion of leads of circuit components. This drawing provides all of the necessary dimensions and drilling information required for an individual printed board. Where a plurality of identical boards are desired, all identically dimensioned and punched with holes, a tool for punching the holes and blanking the panels can be designed on the basis of the facsimile drawing. In the past, a plurality of such tools have been necessary because often it was not practical to use the same panel size or the same hole pattern for a variety of circuit configurations.

The assembly drawing is a representation of the completed circuit on the assembly side of the board, that is, on the side of the board on which the components are mounted, which is usually opposite the side on which the printed pattern is disposed. This drawing is ordinarily prepared to scale, and it requires considerable time and skill for its preparation.

The time and material that are required for the preparation of these drawings add very considerably to the expense of converting circuit configurations into printed wiring assemblies. Moreover, the time that is required, and the services of the skilled personnel required, often introduce delay into production and prolong the manufacturing processes.

One object of the present invention is to provide a printed wiring design technique that reduces the engineering and drafting time required to convert a variety of circuit configurations into printed wiring assemblies.

Another object of the invention is to provide a process for making the artwork for printed wiring cards, that is much faster, easier, and less expensive than conventional methods, yet has the same degree of clarity, cleanness and definition.

Another object of the invention is to provide a method of making the master artwork for printed wiring cards that will not make time-consuming demands on the services of highly trained draftsmen.

Another object of the invention is to provide a printed wiring design technique that permits savings and improved efficiency in storing the drawings for circuits.

Still another object of the invention is to provide a method of the character described that will permit wiring changes to be made without requiring redrawing of all the artwork.

Yet another object of the invention is to provide a process for making printed circuit boards in which all of the land areas are precisely located without the necessity for making painstakingly accurate measurements for each individual circuit configuration.

Another object of the invention is to provide a simplified procedure for the preparation of assembly drawings for printed wiring boards.

Other objects of the invention will be apparent hereinafter from the specification and from the recital of the appended claims.

A preferred printed wiring design technique, according to my invention, involves the use of a basic module. This module involves the packaging of axial lead components and transistors in component board or card assemblies employing printed wiring, in which the cards are of a standard size and have a standard layout or pattern of contact pads and of perforations or holes, and in which the centers of the perforations in the cards are located at the intersections of a grid of imaginary straight lines that intersect to form a pattern of equilateral triangles. The standard layout would also provide small circles or lands of copper or other conductive material about each perforation.

According to my design technique, a card having the standard layout of contact pads, of holes and of lands of copper about each hole in the layout, is reproduced on a sketch sheet. To prepare artwork for a desired printed wiring board, this sketch sheet is marked by an engineer to indicate the desired circuit configuration, and to show which lands must appear on the card, and which paths must be used to connect the lands together and to the contact pads.

A plurality of positive reproductions of the card, with the standard layout of contact pads, holes, and lands of copper about each hole, are also provided, preferably on an enlarged scale. Each positive reproduction is made on a film base having a water-softenable, image-containing coating on one surface thereof. In this coating, the image of the lands in the standard layout are black, as are the markers for the pallet holes, the borders, the identifying indicia, contact pads, and the like; and the remaining areas, including the holes, are transparent or a background color, such as milky white, depending on the film used.

To design a card for a desired circuit configuration, those portions of the coating on one of the positive reproductions, that contain the images of the land areas that are not to be used for the particular circuit configuration, are moistened to soften them. The softened portions of the coating are then scraped away. Strips of black pressure-sensitive tape are then applied to provide interconnection paths. The tape is disposed to avoid the locations of the perforations. This provides artwork that reproduces the desired pattern of conductors on the surface of the base.

This artwork for the printed circuit configuration is then reproduced photographically, and the reproduction is transferred to metal-clad card stock, and the stock is then etched, cleaned, and dried, in a conventional manner. The card stock is then severed along the edge lines of the card that are indicated by the reproduction, to produce standard size cards. A single circuit configuration can be mass-produced in this way on standard size cards. Each card is punched or drilled, preferably in a jig that makes all perforations simultaneously, with the standard pattern of holes. Since the same hole pattern is employed regardless of the circuit configuration, only a single punch setup or drilling jig is needed.

Figure 1:
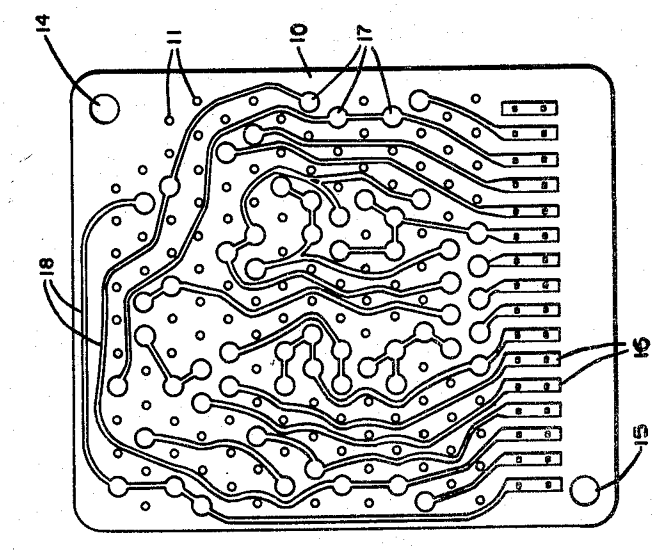
FIG. 1 is a view of a desired printed wiring assembly on a standard size card that is punched with a standard pattern of holes, showing the printed wiring side of the assembly, made according to one embodiment of this invention.
Figure 4:
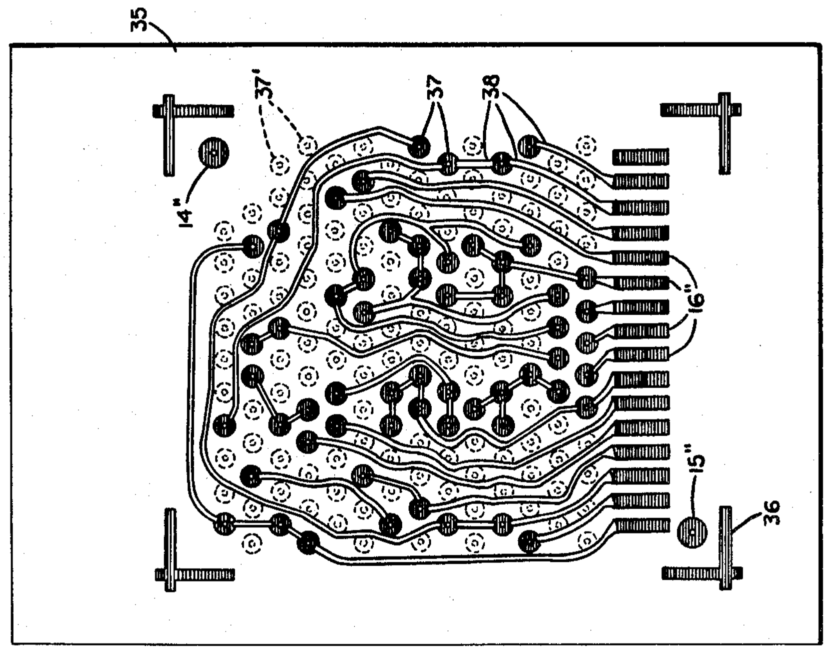
Figure 3:
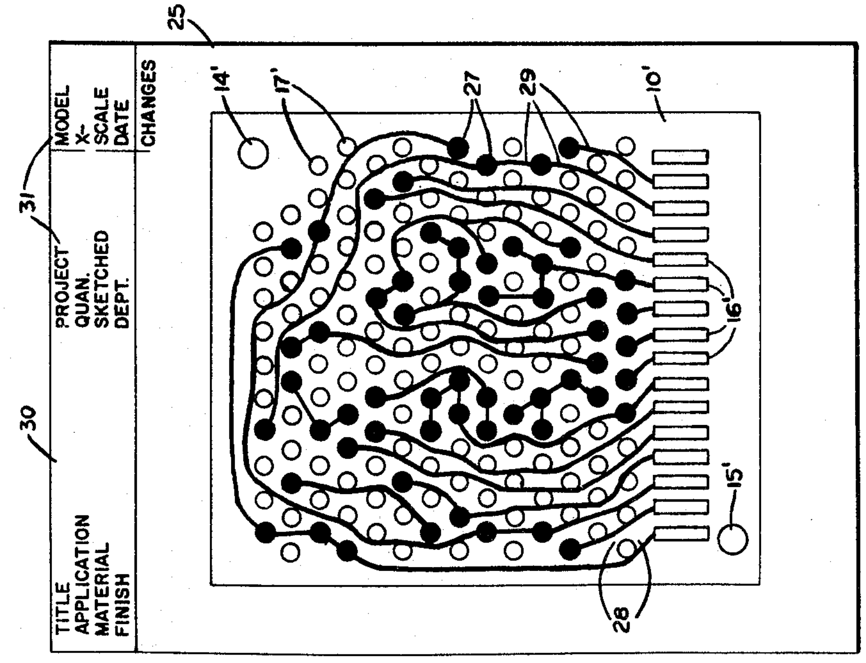

FIG. 3 is a view of a sketch sheet having, on an enlarged scale, a reproduction of the standard layout of lands, contact pads, and pallet holes, according to one embodiment of this invention, and marked to indicate the pattern of interconnection paths and lands required to make the desired card shown in FIG. 1; and FIG. 4 is a view of a positive photographic reproduction of a standard layout of perforations and lands for a standard size card, according to one embodiment of this invention, and having border marks to indicate the corners of the card respectively, and having the reproductions of the unused lands removed but indicated in the drawing by dotted circles, and having black pressure-sensitive tape applied to provide interconnection paths where desired, for the particular pattern of interconnection paths shown in FIG. 1.

Referring to the drawing, and particularly to FIG. 1, 10 denotes a printed wiring card that is generally rectangular in shape, and whose printed wiring side is shown in the drawing. The card 10 has been punched or drilled with a standard pattern of round holes 11, that extend through the thickness of the card. The centers of the holes 11 are located at the intersections of a plurality of imaginary straight lines that intersect to form equilateral triangles. Each of the holes 11 is located at the apex of an equilateral triangle, and each hole is equidistantly spaced from each of its neighboring holes. Moreover, the pattern of holes, and each hole in the pattern, are located in predetermined positions relative to the edges of the card. A pair of pallet holes 14, 15 respectively, are provided in the upper righthand and lower lefthand corners of the card 10, at predetermined locations, conforming to automation standards.

The printed wiring includes elongate rectangular contact pads 16 that are disposed in parallelism along the lower marginal portion of the card 10. The printed wiring also includes several circular lands 17 that form a part of the particular circuit configuration illustrated, and that are coaxial with the holes 11 that they surround, and that are covered by solder in FIG. 1. Interconnection paths 18 are disposed between some of the lands 17 to form a part of the printed wiring pattern for the particular circuit configuration that is illustrated, and also between certain of the lands 17 and the pads 16 as needed in the circuit.

Figure 2:
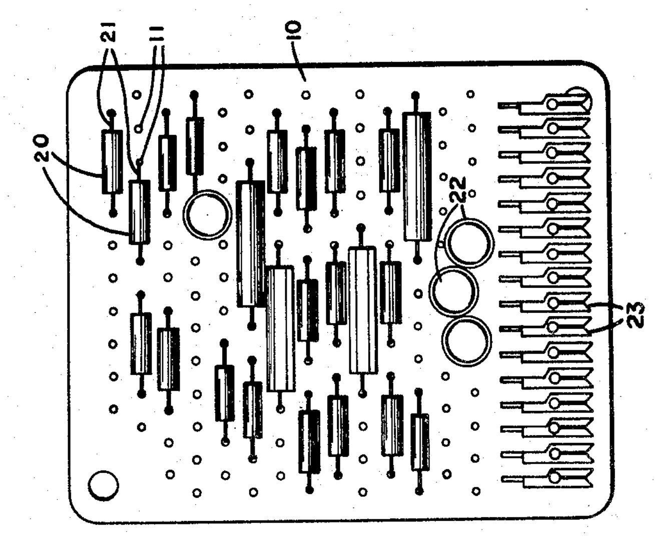
FIG. 2 is a view of the opposite side thereof, showing axial lead circuit components, transistors, and mounting clips mounted on the card.

A plurality of axial lead circuit components 20 (FIG. 2) are mounted on the component or mounting side of the card 10, with their leads 21 inserted in preselected holes 11 and soldered to the associated lands 17 on the wiring side of the card. A plurality of transistors 22 are also mounted on the card with their pins or leads (not shown) inserted in preselected holes 11 for electrical contact with the associated respective lands 17 on the wiring side of the card. The contact pads 16 extend through the thickness of the card 10, and a plurality of fasteners 23 are secured to the contact pads 16 for securing the card assembly to a mounting jack.

The printed wiring card 10 differs from printed wiring cards previously produced in that it has a standard size, to which all cards, including those having different circuit configurations, should conform; and in that it has a standard pattern of holes 11 punched or drilled through its thickness, even though some of the holes are not used for the particular circuit configuration shown.

To make this card, a design technique is employed that is based on the basic module comprising a card of standard size, that is punched with a standard pattern of holes, as described above. To facilitate the conversion of a circuit configuration into a printed wiring assembly, two drawings are needed that are based on the standard layout of holes and the standard size of the card, and that can be used for designing substantially any desired circuit configuration.

The first of these drawings is a sketch sheet 25, which is preferably reproduced as a printed form, and which has a black line reproduction 10′ of a card and has a standard layout of circles 17′ thereon. These circles 17′ represent the circular lands, and they have centers that are disposed at the intersections of the imaginary straight lines 28 that intersect to form a grid of equilateral triangles, and that coincide with the centers of the holes, which are not shown on the sketch sheet. The positions of the pallet holes are indicated by circles 14′, 15′, respectively. The rectangular contact pads are depicted as rectangular blocks 16′. The sketch sheet 25 is provided with a heading area 30, within which any desired identification indicia 31 can be printed. Dimensional indications (not shown) can also be provided to indicate to the engineer the standard size of the card. In FIG. 3, certain of the lands 17 have been colored solidly as denoted at 27, and several lines 29 representing interconnection paths have been sketched in, to depict the pattern of conductors required for the desired circuit shown in FIG. 1.

The second drawing that is required is a single black ink, dimensionally accurate drawing of a standard pattern of holes, with circular lands about the holes, and showing the standard row of contact pads, and pallet holes, and having corner markers to denote the four corners of the card, and that can be reproduced photographically to provide a master negative and as many positives as desired. The positive reproductions are made on film having a dimensionally stable base, one surface of which is coated with a water-softenable gelatin emulsion. The image or reproductions are formed in the gelatin coating. Light sensitive sheets that are suitable for making the negatives and positives are those sold, for example, under the trademarks "Cronaflex," a registered trademark of E. I. du Pont de Nemours and Company, Inc., Wilmington, Delaware, and "Stabilene," a registered trademark of Keufel and Esser Company, Buffalo, New York. A modified positive reproduction of the second drawing is denoted by 35 in FIG. 4. This modified positive 35 includes four corner brackets 36 whose inner margins denote the locations of the edges adjacent the corners of a standard sized card. The reproduction 35 also indicates the location, with respect to the corners of the card, of the lands 37 that are needed for the desired printed wiring card and of the lands 37′ that are not needed and that have therefore been removed (shown by dotted lines). The holes are located at the centers of these lands. Black pressure sensitive tape strips 38 are secured to the surface of the reproduction 35, following in general the paths 28 on the sketch sheet 25, and avoiding the locations of the holes. The reproduction 35 also shows the locations 14″ and 15″ of the pallet holes, respectively, and the location 16″ of the contact pads.

The sketch sheet 25 and the positive reproduction of the second drawing can be used in the following manner, in the production of a printed wiring card 10 from metal-clad card stock. An engineer marks on the sketch sheet 25, preferably in colored pencil, such as red pencil, those land areas 17' that are to be used for a desired circuit configuration, and the colored land areas are denoted in the drawing at 27. The engineer also sketches in the interconnection paths 29 that are necessary between some of the land areas 27, and between some of the land areas 27 and certain of the rectangles 16' denoting the contact pads, as necessary for the desired circuit. The designer or engineer may also sketch, on the same sketch sheet 25, in a differently colored pencil such as a green pencil (not shown), those circuit components such as resistors, transistors, and the like, that are required in the desired circuit configuration, and that will be mounted on the mounting side of the card. In this way the engineer or designer provides the draftsman with the necessary information to prepare the artwork.

The draftsman now prepares the second drawing, and makes several positive reproductions of it. Then, working from the engineer's sketch sheet 25, on which the engineer has sketched the desired circuit configuration, the draftsman prepares the artwork using a positive reproduction of the second drawing. First, the portions of the positive, that contain the reproductions of those lands 37' that are not needed for the desired circuit configuration, are moistened to soften the gelatinous, image-containing coating. After the gelatin softens, the reproductions of the unwanted lands are scraped out. Strips 38 of black pressure-sensitive tape are applied to the positive 35, following in general the paths indicated on the engineer's sketch sheet 25, to provide the interconnection paths required for the desired circuit configuration, as indicated by the design engineer on his sketch sheet. The positive can be placed over the sketch sheet with the patterns of lands in registry, so that the sketch sheet is visible through the positive, to provide a guide for the application of the tape strips so that they avoid the hole locations. The positive 35, with only the images 37 of the desired lands remaining, and with strips 38 of black pressure-sensitive tape applied to indicate the desired interconnection paths, is reproduced photographically in positive form for use in printing metal-clad stock to form standard size cards having the desired circuit configuration. As soon as the positive 35 has been reproduced, it can be destroyed. Preferably, one negative and one positive reproduction are permanently filed as master artworks for that particular circuit. These require less storage space than tape artworks and are not susceptible to circuit changes by reason of tape shifting or creep. Other positives are then used for the fabrication of printed wiring cards.

This technique affords a substantial reduction in the drafting time required to convert a desired circuit configuration to printed wiring cards. Moreover, the artwork with tape is destroyed after a minimum amount of time and handling, sufficient only to permit checking and reproduction. To produce a plurality of identical printed wiring cards, the positive reproduction of the printed pattern is employed to produce a step and repeat negative as required. Following present procedures, an entire board is then etched to produce a plurality of identical printed patterns that can be so spaced that a minimum of board area is wasted. A punch and blank tool can be provided that conforms to the basic module of a card of standard size and a standard layout of holes. The etched board, with its plurality of identical card patterns, is then fed into this tool, which punches all holes simultaneously, including the pallet holes 14, 15, in the first card pattern, then steps to the second card where it punches all holes simultaneously and at the same time blanks or severs the first card from the board. The pallet holes permit the cards to be supported on pallets in automation machinery, in subsequent assembly operations. This operation is repeated until all of the cards have been severed from the board. When a production run is changed from one circuit configuration to another, it is not necessary to change this tool in any way because all cards conform to a standard size and all of the holes in each card are always punched.

Each etched, punched card is then ready for complete automatic assembly on conveyor belt machinery, to mount on the card all of the circuit components that are compatible to this method.

Assembly drawings can be made with ease from the engineer's sketch sheet. A pattern of the card, as viewed from the component side, showing the location of the holes only, is photographically reproduced on drafting cloth. The draftsman then can easily position all of the components, and can scrape out the hole locations that are hidden from sight by the components, to complete a picture of the assembly side of the card with the components mounted in their proper places. When such an assembly drawing is available, with the hole pattern indicated, the required setup time, to orient machinery, is greatly reduced since the positions of the various components can be predetermined from the assembly drawing. As a result, production speed is increased, longer runs are made possible, and a minimum tooling expense is involved.

In addition to the many other advantages of my design technique, the use of the hole pattern described permits the circuit components to be mounted in many different angular orientations with the same lead spacing. This is another example of the flexibility of this design technique.

The standard hole pattern preferably is in a standard predetermined location on each card, with respect to at least two of the edges of the card. For manufacturing convenience, usually the lower left hand corner of the card is taken as the point of origin, and the hole locations are dimensioned from that corner in terms of rectilinear coordinates. This preferred arrangement eliminates the necessity for dimensioning components and lands on the engineer's sketch sheet, since these dimensions are already standardized. The pattern of perforations can also be located in reference to the row of contact pads 16 and the mounting clips 23, that are secured to the contact pads 16.

The word "photographic," and derivatives thereof, are used herein in the broadest dictionary sense, to describe reproductions made by photography. Photography is a process of producing images on sensitized surfaces by the action of any form of radiant energy. The images produced may be either visible or invisible. If invisible, they are further treated or developed to produce a visible image.

While the invention has been described in connection with a specific embodiment thereof, it will be understood that it is capable of further modification, and this application is intended to cover any variations, uses, or adaptations of the invention following, in general, the principles of the invention and including such departures from the present disclosure as come within known or customary practice in the art to which the invention pertains and as may be applied to the essential features hereinbefore set forth, and as fall within the scope of the invention or the limits of the appended claims.

Having thus described my invention what I claim is:

1. A process for making printed circuit card artwork, the steps comprising: coating a dimensionally stable base in a predetermined pattern with a contrasting removable emulsion, removing a selected portion of said removable emulsion from said predetermined pattern leaving only a required portion of said predetermined pattern, and selectively interconnecting said required portion of said predetermined pattern with conductor paths that contrast to said base.

2. The process defined in claim 1 further including the step of photographically reproducing said base as prepared in claim 1.

3. A process for making printed circuit card artwork, the steps comprising: coating a dimensionally stable base in a predetermined pattern representing land areas arranged in a given geometrical relationship with a contrasting removable emulsion, removing said removable emulsion representing selected land areas from said predetermined pattern leaving only desired ones of said land areas in said predetermined pattern, and selectively interconnecting said desired ones of said land areas with conductor paths that contrast to said base.

4. A process for making printed circuit card artwork, the steps comprising: coating a dimensionally stable base in a predetermined pattern with a contrasting water softenable removable coating, softening a selected portion of said removable coating in said predetermined pattern, removing said softened portion leaving only a required portion of said predetermined pattern, and selectively interconnecting said required portion of said predetermined pattern with conductor paths that contrast to said base.

5. The process defined in claim 4 further including the step of photographically reproducing said base as prepared in claim 4.

6. A process for making printed circuit card artwork, the steps comprising: coating a dimensionally stable base with a contrasting removable emulsion disposed in a predetermined pattern of circular land areas all of the same size and whose centers are located, respectively, at the intersections of imaginary straight lines that intersect to form equilateral triangles, selectively removing selected ones of said circular land areas leaving only the other ones of said circular land areas required for a particular circuit pattern, and selectively interconnecting said other ones of said circular land areas of said predetermined pattern with conductor paths that contrast to said base.

7. A process for making printed circuit card artwork, the steps comprising: coating a dimensionally stable base with a contrasting removable emulsion disposed in a predetermined pattern of isolated land areas located, respectively, at the intersections of imaginary straight lines that intersect to form equilateral triangles, removing selected ones of said land areas leaving only the other ones of said land areas required for a particular circuit pattern, and selectively interconnecting said other ones of said land areas of said predetermined pattern with conductor paths that contrast to said base.

8. A process for making printed circuit card artwork for a first and second circuit pattern, the steps comprising: coating a first and second dimensionally stable base with a contrasting removable emulsion disposed in a predetermined pattern of isolated land areas located, respectively, at the intersections of imaginary straight lines that intersect to form equilateral triangles, removing from said first and second bases selected ones of said land areas leaving only the other ones of said land areas required for said first and second circuit pattern, respectively, and selectively interconnecting said other ones of said land areas of said predetermined pattern with conductor paths that contrast to said first and second bases, respectively.

References Cited in the file of this patent

UNITED STATES PATENTS

| | | |
|---|---|---|
| 1,736,445 | Jannenga et al. | Nov. 19, 1929 |
| 2,383,566 | Rudnick | Aug. 28, 1945 |
| 2,383,567 | Rudnick | Aug. 28, 1945 |
| 2,610,413 | Dasey | Sept. 16, 1952 |
| 2,769,119 | Martin et al. | Oct. 30, 1956 |

OTHER REFERENCES

Swiggett: "Intro. to printed Circuits," Rider Publ. Co., New York, 1956.

Klippel et al.: Elec. Manufacturing, January 1956, pp. 96, 41–P.C.